(12) United States Patent
Ho

(10) Patent No.: US 7,042,088 B2
(45) Date of Patent: May 9, 2006

(54) PACKAGE STRUCTURE WITH TWO SOLDER ARRAYS

(76) Inventor: Tony H. Ho, 11Fl.-2, No. 171, Wuling Rd., Hsinchu City (TW)

( * ) Notice: Subject to any disclaimer, the term of this patent is extended or adjusted under 35 U.S.C. 154(b) by 0 days.

(21) Appl. No.: 10/796,253

(22) Filed: Mar. 10, 2004

(65) Prior Publication Data

US 2005/0200013 A1  Sep. 15, 2005

(51) Int. Cl.
*H01L 23/52* (2006.01)
(52) U.S. Cl. ...................... 257/738; 257/778
(58) Field of Classification Search ............. 257/781, 257/738, 772; 438/108, 612, 613
See application file for complete search history.

(56) References Cited

U.S. PATENT DOCUMENTS 5,569,960 A * 10/1996 Kumazawa et al. ........ 257/738
5,598,036 A * 1/1997 Ho ............................ 257/738
5,907,187 A * 5/1999 Koiwa et al. .............. 257/737
5,956,606 A * 9/1999 Burnette .................... 438/615
6,455,785 B1 * 9/2002 Sakurai et al. ............. 174/260
6,657,124 B1 * 12/2003 Ho ........................... 174/52.4
2002/0079577 A1 * 6/2002 Ho ............................ 257/737

* cited by examiner

*Primary Examiner*—Nathan J. Flynn
*Assistant Examiner*—Ben Sandvik
(74) *Attorney, Agent, or Firm*—Rosenberg, Klein & Lee

(57) ABSTRACT

The present invention includes a semiconductor package that forms the solder array joints on the die surface and corresponding BGA substrate and PCB respectively. The life times of array solder joints are increased through the use of two sets of array joints. The top array comprises a plurality of high melting solder joints and a plurality of low melting solder joints, while the bottom array comprises a plurality of high melting solder joints only. The reflow temperature of SMT assembly is between the aforementioned high melting point and low melting point of solder joints. In addition, each solder joint comprises a flat surface at its front edge.

19 Claims, 3 Drawing Sheets

(a)

(b)

(a)

(b)

PACKAGE STRUCTURE WITH TWO SOLDER ARRAYS

FIELD OF THE INVENTION

The present invention is related to an electronic package in general, and in particularly to an in-line process of PCB assembly using two sets of array solder joints.

BACKGROUND OF THE INVENTION

As the wafer's manufacturing technology keeps on stepping forward, the traditional wire bonding process has no longer fitted into the needs of today's art. The design principle of "light, thin, short, and small" can be achieved through the use of array solderjoints. Hence, the array solderjoints of FC/BGA and Flip Chip (FC) have become the main streams of currently advanced package assembly. FC/BGA method which a semiconductor die is inverted in connecting with a top surface of BGA substrate first, then its bottom surface of BGA substrate is implemented with a PCB; while Flip Chip method that a semiconductor is inverted in connecting with a PCB directly. The life times of solder joints are intimately dependent on the stand-off of array solder joints. If the stand-off of solder joints is not big enough to resist the induced thermal stress exerted by reflow process, the underfill has to be added for reliability assurance. However, the addition of underfill will make repair work be more difficult, and become the bottleneck to its package assembly. Also, the solder pitch of solder joints has to be effectively reduced in order to accommodate more I/O onto the dice. Hence, how to increase the stand-off of solder array as well as to reduce the solder pitch have become two major issues for the criterion of package design. In Ho's patent U.S. Pat. No. 6,657,124B2, the package method using two sets of array solder joints had been proposed. Each solder array comprised a plurality of high melting solder joints and a plurality of low melting solder joints. At connective interface, the high melting solder joints were connected with their correspondingly high melting solders, while the low melting solder joints were connected with their correspondingly low melting solder joints. After reflow stage, the high melting solder joints which were mainly served as the pillars to sustain the stand-off of array solder joints and increased their life times. In this patent, the principle of applying two solder arrays is continually used but modified with different methods that are illustrated by the followings.

OBJECTIVES AND SUMMARY OF THE INVENTION

The primary objective of present invention is to provide the reliable connections between a semiconductor die and the PCB through the use of two sets of array solder joints. The top array comprises a plurality of high melting solder joints and low melting solder joints, while the bottom array only comprises a plurality of high melting solder joints.

At connective interface, each solder array comprises two sets of melting solder points. The high melting solder joints are served as the pillars to maintain the stand-off, while the low melting solder joints will turn from the barrel-like shapes into the hourglass-like shapes that exhibit better mechanical strength, after reflow temperature had been cooled down to room temperature. The reflow temperature is between the aforesaid melting points of high melting solder joints and low melting solder joints.

Secondly, each solder joint comprises a flat surface at its front edge in order to facilitate the connections between a top array and its correspondingly bottom array. At bottom array, each flat surface of high melting solder joint is served as the solder pad in connecting with the solder joint of top array. Thirdly, the flat surface of bottom array is designed to have 3% to 70% bigger than that of its correspondingly top array so that the solder paste implemented in between the top array and bottom array can form the solid adhesions. Therefore, the solder pitch will have a chance to reduce below 0.3 mm in accommodating extensive I/O applications.

DETAILED DESCRIPTION OF THE INVENTION

In regular SMT (Surface Mount Technology) process, the solder paste and low melting solder joints are melted at reflow stage. They will first collapse, melt into molten state, and are solidified through surface tension of solder pads in connecting a semiconductor die with a PCB. The stand-off of low melting solder joints will be reduced to 65% to 70% height of barrel ones compared to the solder height of originally circular ones. For the purpose of increasing the life times of solder joints by using two sets of array joints was proposed in Ho's patent U.S. Pat. No. 6,657,124B2. Each solder array comprised a plurality of high melting solder joints and a plurality of low melting solder joints. The high melting solder joints of top array were connected with their correspondingly high melting solder joints of bottom array, while the low melting solder joints of top array were connected with their correspondingly low melting solder joints of bottom array. The melting point of high melting solder joints was defined to have 20° C. higher than the reflow temperature at least, while the melting point of low melting solder joints was defined to have 20° C. lower than the reflow temperature at least. The high melting solder joints were served as the pillars to sustain the stand-off. The low melting solder joints were melted first and formed into the permanent hourglass-like shapes with good mechanical strength. However, there was a risk that the induced crack might be initiated at the middle part of hourglass-like solder joint where the stress concentration was reached a maximum.

The primary objective is to assure that there are solid adhesions between the solder joints of a top array and its correspondingly bottom array. A plurality of embodiments is employed to illustrate the scope and characteristic of present invention.

First, the array solder joints of bottom array are replaced with a plurality of high melting solders only, while the correspondingly top array comprises a plurality of high melting solder joints and low melting solder joints. Second, to facilitate the adhesion between a top array and its correspondingly bottom array, each solder joint comprises a flat surface at its front edge. The flat surfaces of high melting solders located at bottom array are served as the solder pads, since they are not melted at reflow stage. Hence, the induced crack initiated at the middle part of hourglass-like solder joints will be eliminated. Third, the flat surface of bottom array is designed to have 3% to 70% bigger than the flat surface at its correspondingly top array. Also, with the addition of solder paste, the solder joints of top and bottom arrays can be intimately formed together.

Figure 1:
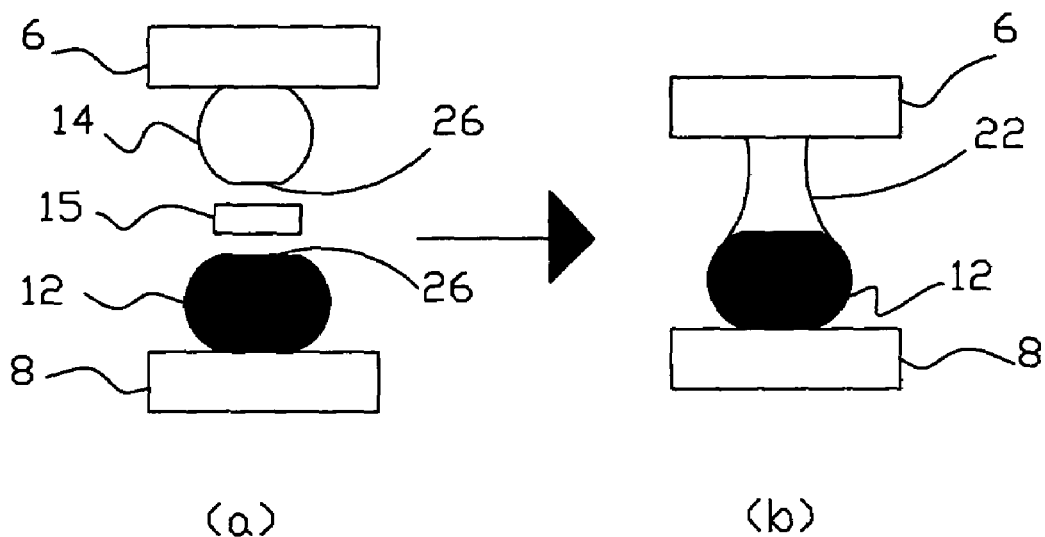
FIG. 1 shows the single structure that a low melting solder joint of top array is attached with a high melting solder joint of bottom array.

FIG. 1 shows the single structure that a low melting solder joint 14 of top array 6 is connected with a high melting solder 12 of bottom array 8. The top array 6 is either located at die surface or located at bottom surface of BGA substrate, while the bottom array 8 is either located at top surface of BGA substrate or located on the surface of PCB. Each solder joint comprises a flat surface 26 at its front edge. The flat surface 26 of top array 6 is 3% to 70% smaller than the flat surface 26 of bottom array 8. The flat surface 26 of bottom array 8 is served as the solder pad in connecting with the solder joint of top array 6. A thin solder paste 15 is implemented in between the top array 6 and bottom array 8. After reflow process, the low melting solder joint 14 is formed into the hourglass-like solder joint 22, while the high melting solder joint 12 is not changed in shape.

Figure 2:
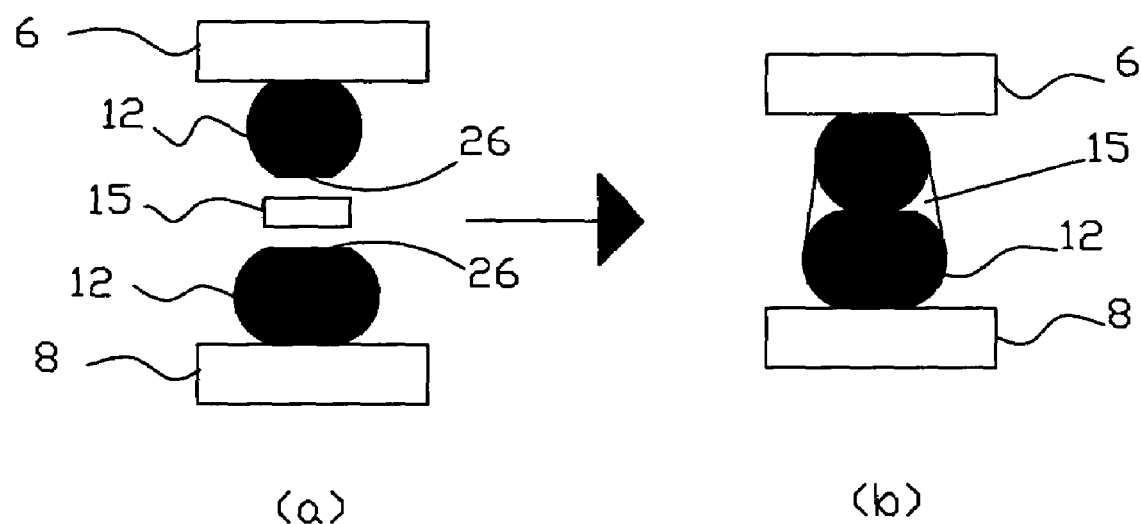
FIG. 2 shows the single structure that a high melting solder joint of top array is attached with a high melting solder joint of bottom array.

FIG. 2 shows the single structure that a high melting solder joint 12 of top array 6 is connected with a high melting solder joint 12 of bottom array 8. The top array 6 is either located at die surface or located at bottom surface of BGA substrate, while the bottom array 8 is either located at top surface of BGA substrate or located on the surface of PCB. Each solder joint comprises a flat surface 26 at its front edge. The flat surface 26 of top array 6 is 3% to 70% smaller than the flat surface 26 of bottom array 8. The flat surface 26 of bottom array 8 is served as the solder pad in connecting with the solder joint of top array 6. A thin solder paste 15 is implemented between the top array 6 and bottom array 8. After reflow process, the high melting solders 12 of top array 6 and bottom array 8 are formed into the integral part together through the adhesion of solder paste 15.

The conventional package structures of FC/BGA and Flip Chip are illustrated with two sets of array solder joints. In FC/BGA structure, a semiconductor die is attached to a BGA substrate first, then the BGA substrate is attached with a PCB to complete the assembly. Multiple chips can be implemented onto the top surface of BGA substrate through the use of two sets of array solder joints. Hence, different functions of IC chips can be integrated into a single package that is so called the system in package (SIP) or named by system on chip (SOC). In Flip Chip structure, a semiconductor die is direct chip attachment (DCA) with a PCB. As compared with FC/BGA structure, because a BGA substrate which has the signal, power and ground lines embedded that is functioned as a specific PCB and belongs to a kind of PCB. In fact, a Flip Chip structure described above is identical with the structure that a semiconductor die is attached to the top surface of BGA substrate, if BGA substrate is considered as a kind of PCB.

(A) FC/BGA Structure

Figure 3:
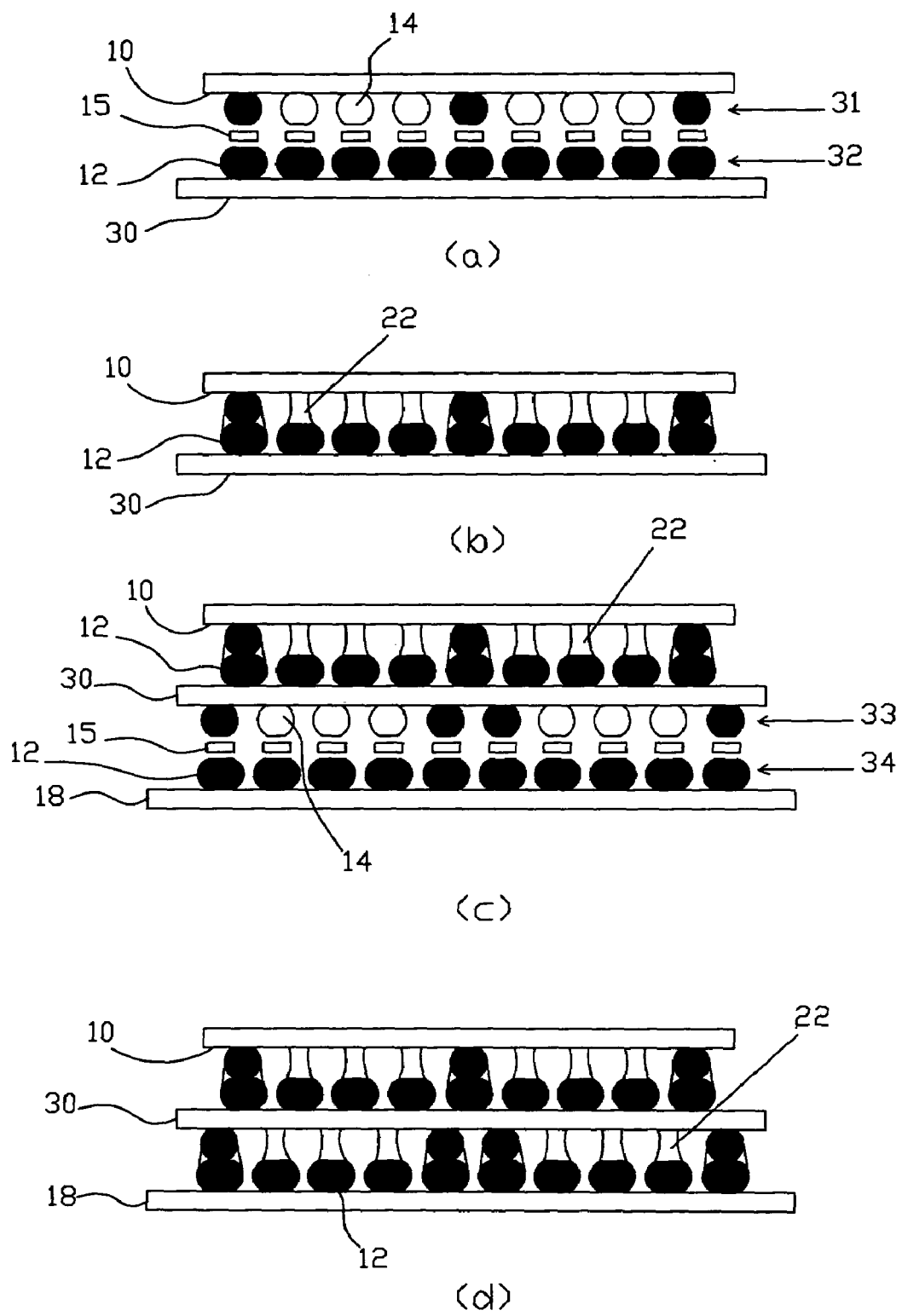
FIG. 3 shows the flow chart that a semiconductor die is attached to a PCB through BGA substrate by using two sets of array solder joints.

FIG. 3 shows the flow chart that a semiconductor die is attached to a PCB through BGA substrate. As shown in FIG. 3a, a first array 31 comprises a first plurality of high melting solder joints 12 and a second plurality of low melting solder joints 14 is integrate with the die surface 10 and projecting downwardly. A second array 32 comprises a third plurality of high melting solder joints 12 is integrated with the top surface of BGA substrate 30. A group of solder paste 15 is position in between the first array 31 and the second array 32. The solder joints located on first array 31 are heading in correspondence with the solder paste 15 and the solder joints located on second array 32.

At die surface 10, the high melting solder joints 12 that are served as the pillars are often located at four corners and also located at middle ground plane. The first array 31 is integral with the second array 32. After reflow process, the first array 31 is attached to the second array 32. The high melting solder joints 12 that are not melted to maintain the stand-off, while the low melting solder joints 14 are formed into hourglass-like shapes 22 as shown in FIG. 3b.

In FIG. 3c, a third array 33 comprises a fourth plurality of high melting solder joints 12 and a fifth plurality of low melting solder joints 14 is implemented with the bottom surface of BGA substrate 30 and projecting downwardly. A fourth array 34 comprises a sixth plurality of high melting solders 12 is implemented with a PCB 18. A group of the solder 15 is positioned in between the third array and the fourth array. The solder joints located on third array 33 are heading in correspondence with the solder paste 15 and the solder joints located on fourth array 34. At bottom surface of BGA substrate 30, the high melting solder joints 12 are often located at four corners and also located at middle ground plane. The third array 33 is integral with the fourth array 34. After reflow process, the third array 33 is attached to the fourth array 34. The high melting solder joints 12 that are not melted in order to maintain the stand-off, while the low melting solder joints 14 are formed into hourglass-like shapes 22 as shown in FIG. 3d. Because the solder joints implemented on the die surface 10 need to pass the reflow process twice, the low melting solder joints 14 implemented on die surface 10 are better to have a higher or equal melting point than that of low melting solder joints 14 implemented on the bottom surface of BGA substrate 30.

(B) Flip Chip Structure

Figure 4:
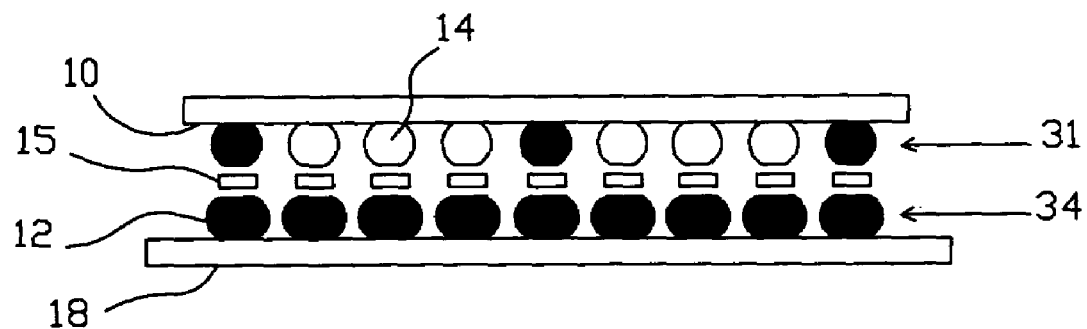
FIG. 4 shows the flow chart that a semiconductor die is attached to a PCB directly through Flip Chip by using two sets of array solder joints.
Figure 4:
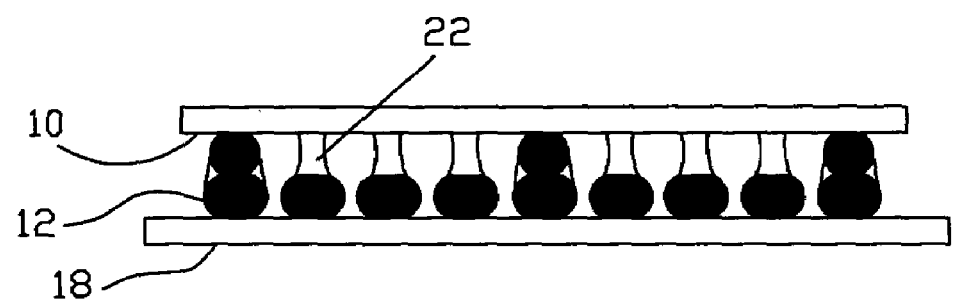

FIG. 4 shows the flow chart that a semiconductor die is attached to a PCB directly. As shown in FIG. 4a, a first array 31 comprises a first plurality of high melting solder joints 12 and a second plurality of low melting solder joints 14 is implemented onto a die surface 10 and projecting downwardly. A fourth array 34 comprises a sixth plurality of high melting solders 12 is implemented on the surface of PCB 18. A group of solder paste 15 is positioned between the first array 31 and the fourth array 34. The solder joints located on first array 31 are heading in correspondence with the solder paste 15 and the solder joints located on fourth array 34. At die surface 10, the high melting solder joints 12 are often located at four corners and also located at middle ground plane. The first array 31 is integral with the fourth array 34. After reflow process, the first array 31 is attached to the fourth array 34. The high melting solder joints 12 that are not melted in order to maintain the stand-off, while the low melting solder joints 14 are formed into hourglass-like shapes 22 as shown in FIG. 4b.

What is claimed is:

1. A semiconductor packaging structure comprising:
    an electrical substrate having a top surface and a bottom surface;
    a semiconductor die overlaying said top surface;
    a printed circuit board underlying said bottom surface;
    a first array comprising a plurality of first solder joints and a plurality of second solder joints mounted on said die surface and projecting downwardly therefrom, said plurality of first solder joints having a higher melting point than said plurality of second solder joints; and a second array comprising a plurality of third solder joints mounted on said top surface, said second array being substantially aligned with said first array to thereby connect said die surface and said top surface, said plurality of third solder joints having a higher melting point than said plurality of second solder joints, said plurality of first solder joints being respectively contacting a corresponding portion of said plurality of third solder joints and said plurality of second solder joints being melted to be integrally joined to a remaining portion of said plurality of third solder joints, said plurality of second solder joints extending between a corresponding one of said remaining portion of said plurality of third solder joints and said die surface.

2. The structure described in claim 1 further comprising:
a group of solder paste located between said first array and said and said second array.

3. The structure described in claim 1 further comprising:
a third ball grid array comprising a plurality of fourth solder joints and a plurality of fifth solder joint mounted on said bottom surface and projecting downwardly therefrom, said plurality of fourth solder joints having a higher melting point than said plurality of fifth solder joints; and a fourth array comprising a plurality of sixth solder joints mounted on said printed circuit board, said fourth array being substantially aligned with said third array to thereby connect said bottom surface and said printed circuit board, and said plurality of sixth solder joints having a higher melting point than said plurality of fifth solder joints.

4. The structure described in claim 3 further comprising:
a group of solder paste located between said third array and said fourth array; said plurality of fourth solder joints and a portion of said plurality of sixth solder joints being respectively in contact one with the other, said plurality of fifth solder joints being melted to be integrally joined to a remaining portion of said plurality of sixth solder joints, said plurality of fifth solder joints extending between a corresponding one of said remaining portion of said plurality of sixth solder joints and said bottom surface.

5. The structure described in claim 4 wherein each of said plurality of fourth and sixth solder joints have a flat contact surface on opposing ends thereof.

6. The structure described in claim 5 wherein said flat surface implemented on said die surface is 3% to 70% smaller than said corresponding flat surface implemented on said top surface.

7. The structure described in claim 5 wherein said flat surface implemented on said bottom surface is 3% to 70% smaller than said corresponding flat surface implemented on said print circuit board.

8. The structure described in claim 4 wherein said semiconductor package had been assembled, said plurality of fourth solder joints and said plurality of sixth solder joints were not melted; and said plurality of fifth solder joints and said solder paste were melted, said plurality of fifth solder joints each have a substantially hourglass contour.

9. The structure described in claim 1 wherein said plurality of first solder joints are located at four corners of said die surface.

10. The structure described in claim 1 wherein said plurality of first solder joints are located at a middle ground plane of said die surface.

11. The structure described in claim 3 wherein said plurality of fourth solder joints are located at four corners of said bottom surface.

12. The structure described in claim 3 wherein said plurality of fourth solder joints are located at middle ground plane of said bottom surface.

13. The structure described in claim 3 wherein said plurality of second solder joint having a higher or equal melting point than said plurality of fifth solder joints.

14. The structure described in claim 1 wherein the number of semiconductor dies is more than one.

15. The structure described in claim 1 wherein said solder joints implemented on said die surface are heading in correspondence with said solder joints implemented on said top surface.

16. The structure described in claim 3 wherein said solder joints implemented on said bottom surface are heading in correspondence with said solder joints implemented on said printed circuit board.

17. A semiconductor packaging structure comprising:
at lease one semiconductor die;
a printed circuit board underlying said at least one die;
a die array comprising a plurality of first solder joints and a plurality of second solder joints mounted on a surface of said die and projecting downwardly therefrom, said plurality of first solder joints having a higher melting temperature than said plurality of second solder joints; and a circuit board array comprising a plurality of third solder joints mounted on said printed circuit board for connecting said die surface and said printed circuit board, said plurality of third solder joints having a higher melting temperature than said plurality of second solder joints, said plurality of first solder joints being respectively contacting a corresponding portion of said plurality of third solder joints and said plurality of second solder joints being melted to be integrally joined to a remaining portion of said plurality of third solder joints.

18. The structure described in claim 17 wherein said semiconductor package had been assembled, said plurality of first solder joints and said plurality of third solder joints were not melted; and said plurality of second solder joints were melted, said plurality of second solder joints each have a substantially hourglass contour.

19. The structure described in claim 2 wherein said semiconductor package had been assembled, said plurality of first solder joints and said plurality of third solder joints were not melted; and said plurality of second solder joints and said solder paste were melted, said plurality of second solder joints each have a substantially hourglass contour.

* * * * *